(12) United States Patent
Abela et al.

(10) Patent No.: US 6,858,933 B2
(45) Date of Patent: Feb. 22, 2005

(54) INJECTION MOLD FOR AN OPTICAL SEMICONDUCTOR PACKAGE AND CORRESPONDING OPTICAL SEMICONDUCTOR PACKAGE

(75) Inventors: Jonathan Abela, Grenoble (FR); Christophe Prior, Le Versoud (FR)

(73) Assignee: STMicroelectronics S.A., Montrouge (FR)

( * ) Notice: Subject to any disclaimer, the term of this patent is extended or adjusted under 35 U.S.C. 154(b) by 45 days.

(21) Appl. No.: 09/862,984

(22) Filed: May 22, 2001

(65) Prior Publication Data

US 2002/0043703 A1 Apr. 18, 2002

(30) Foreign Application Priority Data

May 22, 2000 (FR) .............................. 00 06513

(51) Int. Cl.[7] .............................................. H01L 23/02
(52) U.S. Cl. ...................................... 257/730; 257/787
(58) Field of Search ................................ 257/678, 680, 257/787, 792, 704, 666; 438/26, 116

(56) References Cited

U.S. PATENT DOCUMENTS

| | | | |
|---|---|---|---|
| 4,644,384 A | * 2/1987 | Charoensakvirochana et al. | 438/116 |
| 5,164,144 A | * 11/1992 | Rose | 264/511 |
| 5,913,110 A | * 6/1999 | Herbst | 438/126 |
| 5,998,862 A | * 12/1999 | Yamanaka | 257/704 |

FOREIGN PATENT DOCUMENTS

| | | |
|---|---|---|
| JP | 01255514 | 10/1989 |
| JP | 07214600 | 8/1995 |
| JP | 07254623 | 10/1995 |
| JP | 09018027 | 1/1997 |
| JP | 09191022 | 7/1997 |

OTHER PUBLICATIONS

French Preliminary Search Report dated Feb. 20, 2001 for French Application No. 0006513.

* cited by examiner

*Primary Examiner*—W. David Coleman
(74) *Attorney, Agent, or Firm*—Lisa K. Jorgenson; Stephen Bongini; Fleit, Kain, Gibbons, Gutman, Bongini & Bianco P.L.

(57) ABSTRACT

An injection mold is provided for encapsulating an integrated circuit chip to form a semiconductor package. The injection mold includes at least one injection cavity for housing the chip, and an insert having a front part that forms part of the wall of the injection cavity. A transverse surface of the insert has a roughness that is chosen such that the face of the semiconductor package has a suitable roughness in a corresponding region. Also provided is a semiconductor package that includes an encapsulation block and an integrated circuit chip. The material of the encapsulation block is transparent. One face of the chip includes an optical sensor and lies parallel to a transverse face of the encapsulation block. The transverse face of the encapsulation block includes a region that has a roughness that is less than the roughness of at least the rest of the transverse face.

22 Claims, 6 Drawing Sheets

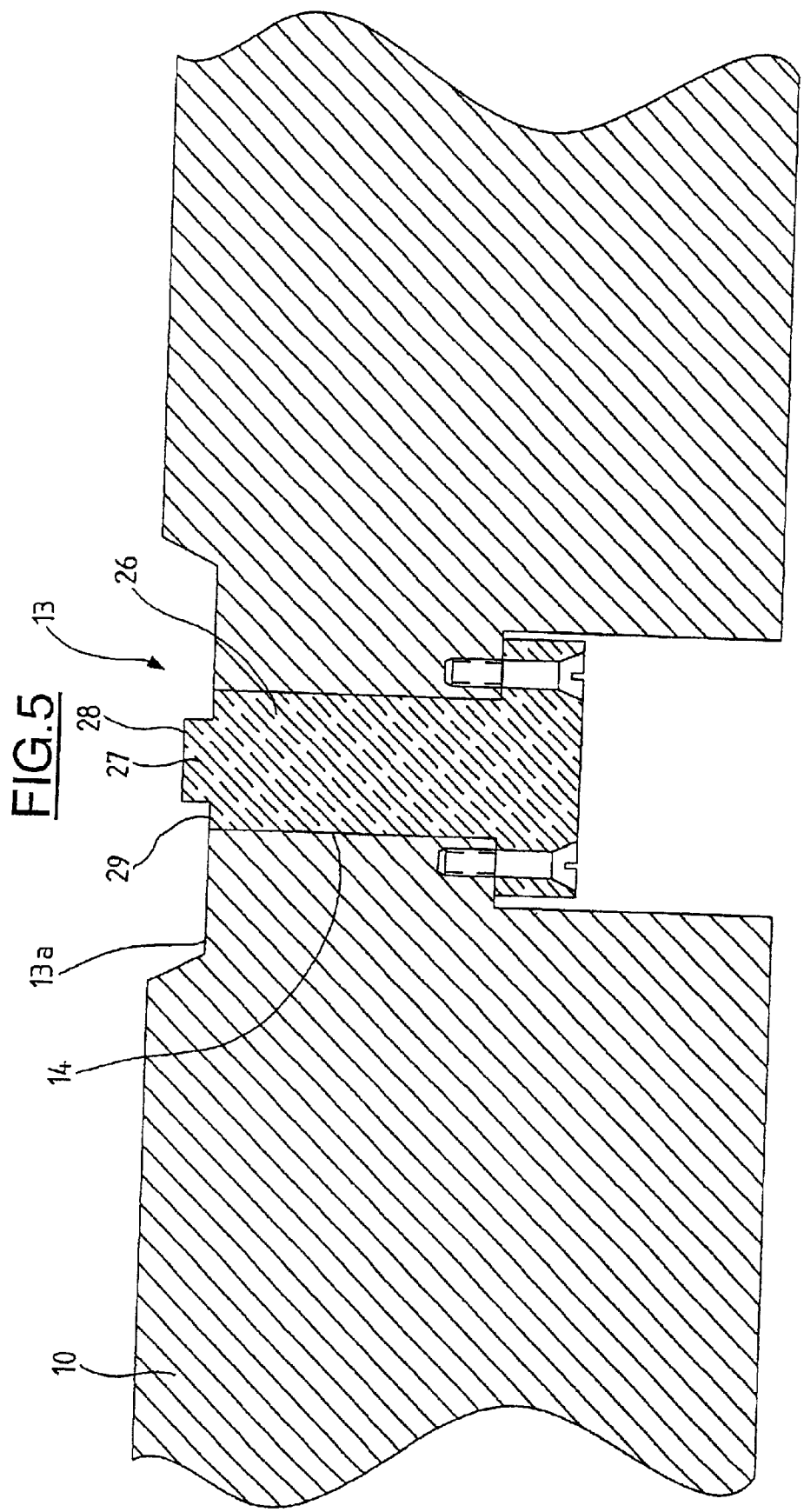

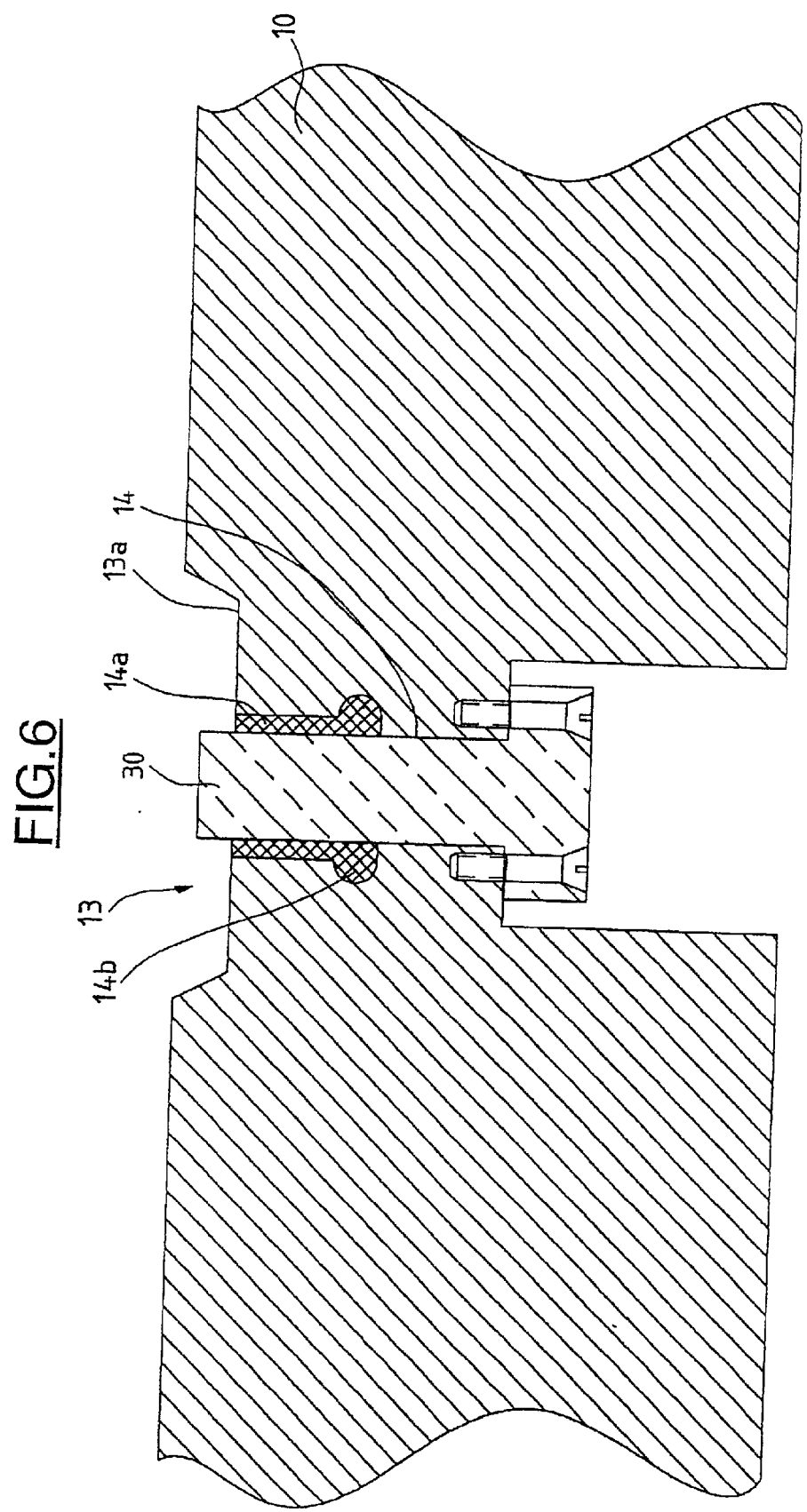

INJECTION MOLD FOR AN OPTICAL SEMICONDUCTOR PACKAGE AND CORRESPONDING OPTICAL SEMICONDUCTOR PACKAGE

CROSS-REFERENCE TO RELATED APPLICATIONS

This application is based upon and claims priority from prior French Patent Application No. 00-06513, filed May 22, 2000, the entire disclosure of which is herein incorporated by reference.

Additionally, this application is related to the application "MOLD FOR FLASHLESS INJECTION MOLDING TO ENCAPSULATE AN INTEGRATED CIRCUIT CHIP," Ser. No. 09/862,983, now U.S. Pat. No. 6,696,006, which was filed on the same day as the present application and commonly assigned herewith to STMicroelectronics S.A. This related application is herein incorporated by reference.

BACKGROUND OF THE INVENTION

1. Field of the Invention

The present invention relates to semiconductor packages, and more specifically to an injection mold for encapsulating an integrated circuit chip so as to form a semiconductor package and a corresponding semiconductor package.

2. Description of Related Art

In a typical semiconductor package fabrication process, an injection mold is used to encapsulate an integrated circuit chip so as to form the semiconductor package. Currently, a conventional injection mold used in such a fabrication process includes two parts between which an injection cavity is formed. A chip carried by a leadframe is inserted into the mold cavity. The appearance and the roughness of the external surface of the package that is obtained result directly from the roughness $R_a$ of the wall of the mold cavity. If it is desired to obtain less roughness over the entire surface of the package or over a particular region of this surface, the conventional solution is to carry out a corresponding polishing operation on the wall of the mold cavity. However, such an operation is difficult and costly. Moreover, if part of the cavity is damaged, it is necessary to change the entire corresponding part of the mold, which is also costly.

SUMMARY OF THE INVENTION

In view of these drawbacks, it is an object of the present invention to overcome the above-mentioned drawbacks and to provide an improved injection mold that can advantageously be used for the fabrication of semiconductor packages containing an integrated circuit chip in a transparent encapsulation material.

Another object of the present invention is to provide an injection mold for use in fabricating a semiconductor package containing an integrated circuit chip that includes an optical sensor on one face.

Yet another object of the present invention is to provide a semiconductor package that has a transverse face and contains an integrated circuit chip, with one face of the chip including an optical sensor.

One embodiment of the present invention provides an injection mold for encapsulating an integrated circuit chip so as to form a semiconductor package containing the chip. The injection mold includes at least one injection cavity for housing the chip, and an insert having a front part that forms part of the wall of the injection cavity and a transverse surface that lies parallel to one face of the chip. The transverse surface of the insert has a roughness that is chosen such that the face of the semiconductor package has a suitable roughness in a region corresponding to the transverse surface of the insert. In a preferred embodiment, the injection mold further includes first and second parts between which the injection cavity is defined. The first part carries the insert in such a way that the transverse surface of the inverse lies parallel to the parting line of the first and second parts. The second part is provided with at least one movable demolding member opposite the insert and means for keeping the demolding member bearing on the package when the second part of the mold is separated from the first part of the mold during demolding.

Another embodiment of the present invention provides a semiconductor package that includes an encapsulation block having a transverse face, and at least one integrated circuit chip that is contained in the encapsulation block. The material of the encapsulation block that encapsulates the chip is transparent. One face of the chip includes an optical sensor and lies parallel to the transverse face of the encapsulation block. The transverse face of the encapsulation block includes a region located opposite the optical sensor that has a roughness that is less than the roughness of at least the rest of the transverse face of the encapsulation block. In one preferred embodiment, the roughness of the region of the transverse face of the encapsulation block of the semiconductor package is less than 0.10.

Other objects, features, and advantages of the present invention will become apparent from the following detailed description. It should be understood, however, that the detailed description and specific examples, while indicating preferred embodiments of the present invention, are given by way of illustration only and various modifications may naturally be performed without deviating from the present invention.

BRIEF DESCRIPTION OF THE DRAWINGS

FIG. 5 shows another embodiment for a part of the injection mold; and

FIG. 6 shows yet another embodiment for a part of the injection mold.

DETAILED DESCRIPTION OF PREFERRED EMBODIMENTS

Preferred embodiments of the present invention will be described in detail hereinbelow with reference to the attached drawings.

The present invention provides an injection mold for encapsulating at least one integrated circuit chip so as to form a semiconductor package containing this chip. The mold has at least one injection cavity for housing the chip, and includes an insert having a front part forming part of the wall of the cavity and having a transverse surface which lies parallel to one face of the chip located in the cavity. This allows the face of the package that is obtained to have a suitable roughness in the region of the transverse surface of the insert.

In one embodiment of the present invention, the insert protrudes into the interior of the cavity so as to form a hollow in the package in the region corresponding to the transverse surface of the insert. In some embodiments, the front part of the insert advantageously has a protruding transverse surface surrounded by an annular shoulder set back with respect to this transverse surface. In preferred embodiments, the mold includes a blind annular space made around the insert and emerging in the cavity. The annular space is preferably enlarged in a part remote from the cavity.

In some embodiments of the present invention, the mold has two parts between which the cavity is defined, with the first part carrying the insert in such a way that its transverse surface lies parallel to their parting line. The second part is provided with at least one movable demolding member or pusher opposite the insert to make it possible to keep this member bearing on the package after injection when the second part of the mold is separated from the first part. The first part of the mold preferably includes pushers for demolding the package that is obtained.

The present invention also provides a semiconductor package which has a transverse face and contains an integrated circuit chip, one face of which includes an optical sensor and lies next to and parallel to the transverse face. The material encapsulating the chip is transparent and the transverse face includes a region located opposite the optical sensor having a roughness that is less than the roughness of at least the rest of this surface. The region preferably covers at least the optical sensor, and the roughness of the region is preferably less than 0.10.

Figure 1:
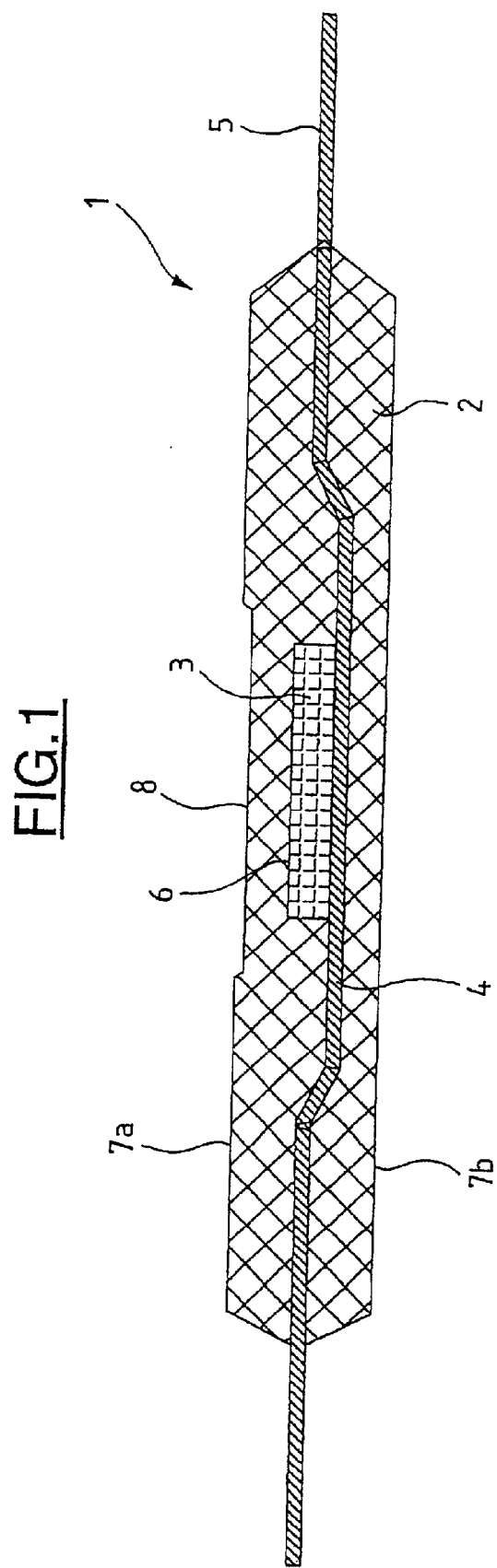
FIG. 1 shows a longitudinal section of a semiconductor package according to a preferred embodiment of the present invention.

FIG. 1 shows a semiconductor package according to a preferred embodiment of the present invention. The semiconductor package 1 includes a parallelepipedal encapsulation block 2 of transparent resin, such as an unfilled or lightly filled epoxy resin. The encapsulation block 2 contains an integrated circuit chip 3 supported on one side by a leadframe 4 which has connection leads 5 which extend laterally out of the block 2. The chip 3 has a transverse face 6 which includes an optical sensor and lies parallel to a transverse face 7a of the wall of the block 2.

In its central part, the transverse face 7a of the block 2 of the package 1 has a region 8 which is larger than the transverse face 6 of the chip. The roughness $R_a$ of the region 8 is markedly less than the roughness of the rest of the wall of the block 2. The roughness of the region 8 is chosen so as to disturb as little as possible the light flux passing through the region and striking the transverse face 6 of the chip 3 that contains the optical sensor. In particular, the roughness $R_a$ of the region 8 is less than 0.10, and preferably less than 0.07, whereas the roughness of the rest of the wall of the block 2 may be any value and is usually between 1 and 2.

An injection mold for obtaining the semiconductor package described above with reference to FIG. 1 will now be described with reference to FIGS. 2 to 4. The mold 9 includes a lower part 10 and an upper part 11 which have a parting line 12 and between them define an injection cavity 13 including a wall that corresponds to the shape of the wall of the block 2 of the semiconductor package 1. This cavity 13 results from two half-cavities produced in the parts 10 and 11, each having a flat bottom 13a and 13b parallel to the parting line 12.

The lower part 10 of the mold 9 has a vertical passage 14 in which is placed and fixed an insert 15 of cylindrical section so that the front part of this insert 15 has a transverse face 16 which forms the central part of the bottom 13a of the cavity 13. The transverse face 16 of the insert 15 is dimensioned so as to correspond to the region 8 of the semiconductor package 1 and its roughness $R_a$ is chosen so as to obtain the desired roughness in this region 8. The lower part 10 of the mold 9 is furthermore provided with demolding pushers 17 which are placed around and at a certain distance from the insert 15 and are capable of being moved vertically by a driving member 18.

The upper part 11 of the mold 9 has a vertical passage 19 in which a demolding pusher 20 is placed, the front part of which has a transverse face which forms part of the bottom 13b of the cavity 13 and which corresponds approximately to the transverse face 16 of the insert 15. The upper part 11 of the mold 9 is connected to a driving member 22 which makes it possible to move it away from or closer to the lower part 10. The demolding pusher 20 is supported by a movable support 23 which can bear against the fixed stops 24 of the mold 9, and springs 25 are interposed between the member 22 for driving the upper part 11 of the mold 1 and the support 23 for the pusher 20.

Figure 2:
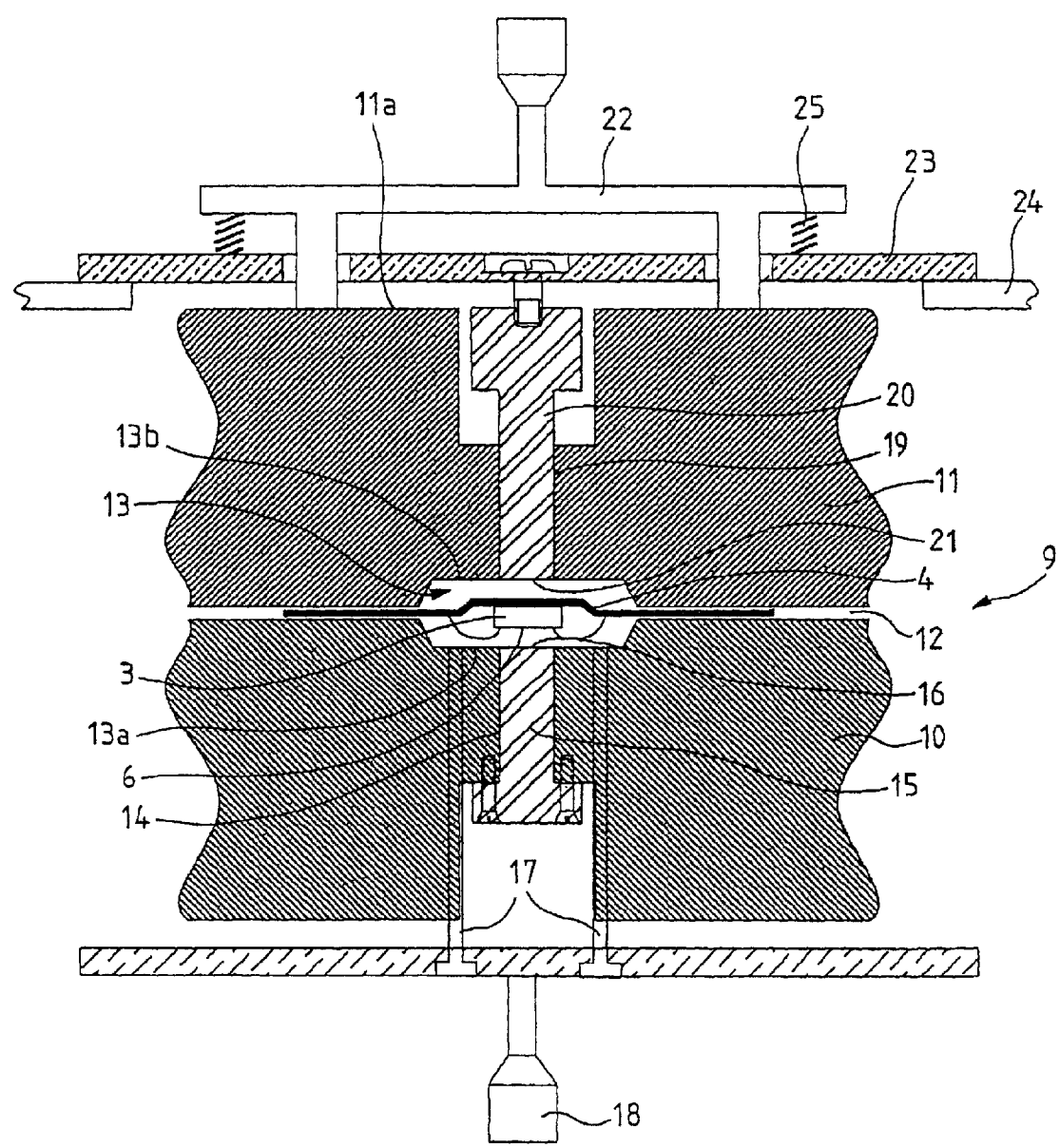
FIG. 2 shows a partial longitudinal section of an injection mold that can be used to form the semiconductor package of FIG. 1.

In order to install the mold 9 in the molding position as shown in FIG. 2, the procedure is as follows. A leadframe 4 provided with a chip is placed on the upper surface of the lower part 10 that constitutes the parting line 12 in such a way that the transverse face 6 with the optical sensor of the chip 3 is turned towards the bottom 13a and is located facing the transverse face 16 of the insert 15. Then, by activating the driving member 22, the upper part 11 of the mold 9 is moved towards its lower part 10 so as to clamp and press therebetween the leadframe 4 in the parting line 12 and close the cavity 13. The mold 9 is then in the closed position shown in FIG. 2.

Before the upper part 11 of the mold 9 reaches this closed position, the movable support 23 which carries the movable demolding member 20 bears against the limit stops 24 and ceases travel. The continuation of the movement of the upper part 11 of the mold 9 as far as its closed position takes place by compressing the springs 25, and the upper part 11 of the mold 9 slides downwards along the demolding pusher 20 until reaching a position in which the transverse face 21 of the pusher 20 is in the plane of the bottom 13b of the cavity 13. Next, with the parts 10 and 11 of the mold 2 firmly held together by any known means, an encapsulation material is injected into the cavity 13 through known means so as to form the encapsulation block 2 and produce the semiconductor package 1 described above with reference to FIG. 1.

When the encapsulation material forming this package 1 has returned to the solid state by cooling, the demolding operation is carried out in the following manner. First, the driving member 22 is activated so as to move the upper part 11 of the mold 9 upwards and away from the lower part 10 until an upper face 11a of the upper part 11 of the mold 9 comes into contact with the movable support 23. During this step, the movable support 23 remains stationary and bears against the limit stops 24 due to the effect of the springs 25, which relax. The upper part 11 of the mold 9 slides upwards along the pusher 20, which remains bearing against the surface 7b of the package 1. Thus, the package is extracted from the half-cavity of the upper part 11 of the mold 9 but remains locked in the half-cavity of the lower part 10 of this mold.

Figure 3:
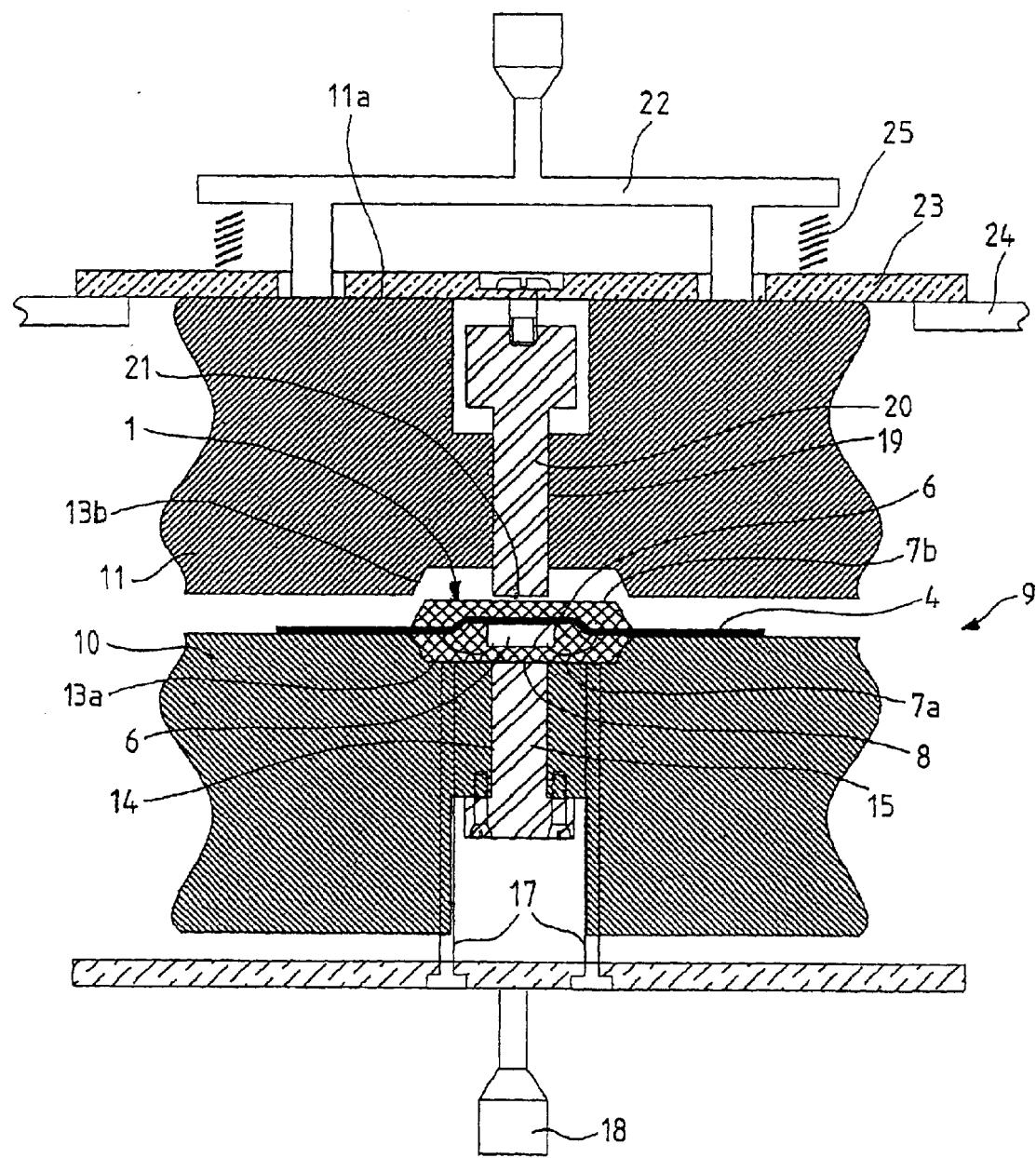
FIG. 3 shows the mold of FIG. 2 in a position before demolding.
Figure 4:
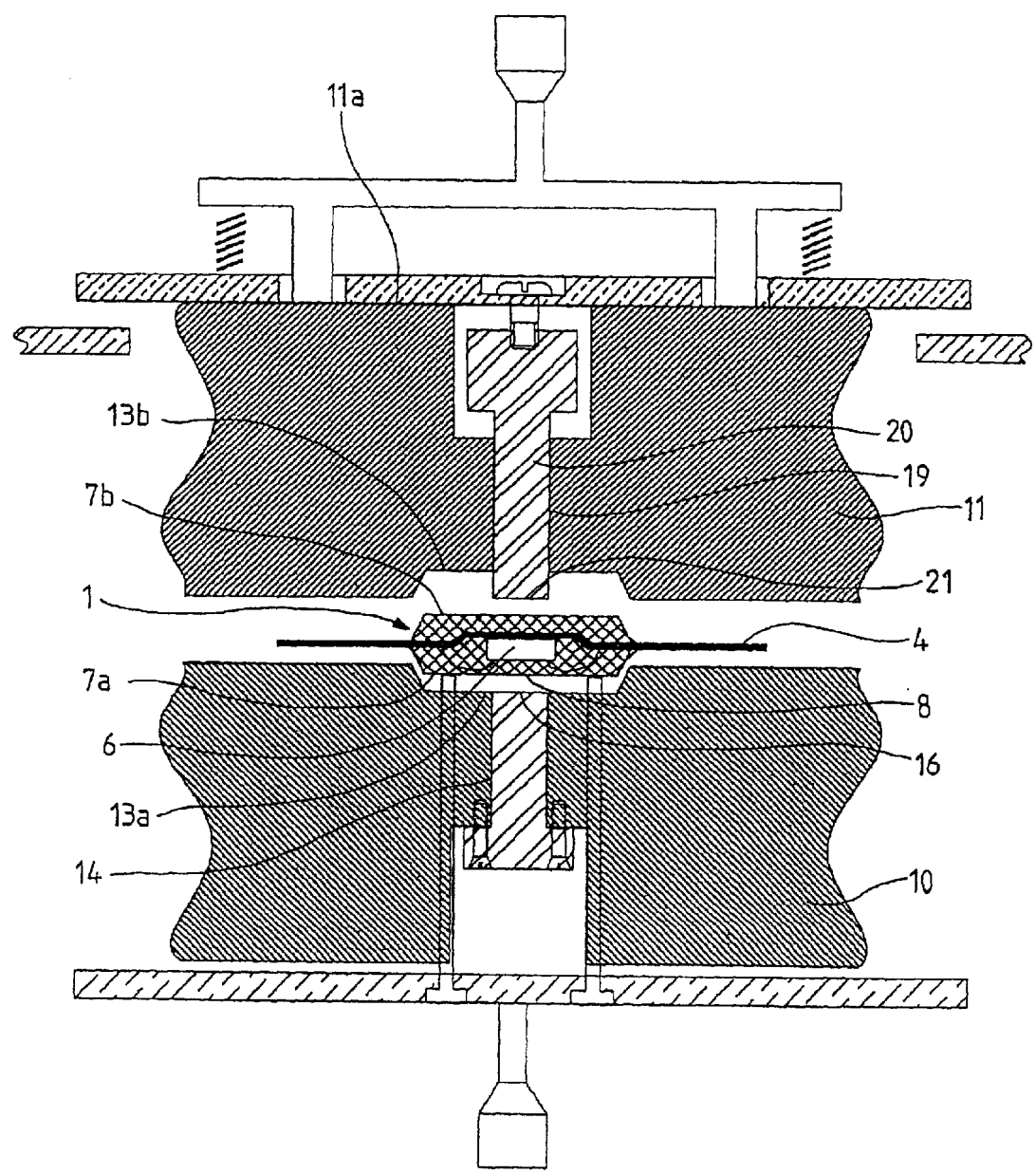
FIG. 4 shows the mold of FIG. 2 in a demolding position.

At the end of this step, the mold 9 is in the intermediate position shown in FIG. 3. Next, the driving member 22 continues to move the upper part 11 of the mold 9 upwards and away from its lower part 10 and drives the movable support 23 and the demolding pusher 20, which then separates from the semiconductor package 1. The position obtained during this step is shown in FIG. 4. Next, as also shown in FIG. 4, the driving member 18 is activated in such a way that the demolding pushers 17 eject the package 1 upwards and out of the half-cavity of the lower part 10 of the mold 9.

The injection mold 9 described above, which may have several cavities 13 so as to produce several packages 1 on a common leadframe 4, has many advantages. For example, the injection mold 9 makes it possible to manufacture a cavity 13 in the parts 10 and 11 of the mold 9 in the usual way (i.e., having a normal roughness $R_a$ of its wall such as between 1 and 2), and to provide a much lower roughness (for example, less than 0.10 and preferably less than 0.07) only on the transverse face 16 of the insert 15.

Furthermore, the injection mold 9 makes it possible to control the ejection or demolding of the package 1 that is obtained by first ejecting it from the upper part 11 of the mold 9 using one demolding pusher 20, and then by ejecting it from the lower part 10 of the mold 9 using another demolding pusher 17. Thus, the separation from the face 7a of the package 1 having the less rough region 8 which is opposite the transverse face 6 of the chip 3 that contains the optical sensor takes place with little or none of the wave effects likely to occur in this region 8, effects which would impair the good transmission of the light rays to the optical sensor through this region.

FIG. 5 shows another embodiment for a part of the injection mold. As shown, in this embodiment the lower part 10 of the mold 9 is fitted with an insert 26 that is different from the insert 15 of the embodiment described above. The front part of this insert 26 includes a protruding part 27 in its central part. The transverse face 28 of the protruding part has a roughness that corresponds to that of the transverse face 16 of the insert 15 described above, and the protruding part 27 is surrounded by an annular shoulder 29 located in the plane of the bottom 13a of the cavity 13.

If the encapsulation material injected into the cavity 13 insinuates between the insert 26 and the passage 14 of the lower part 10 of the mold 9 due to the effect of the injection pressure, flash is liable to remain attached to the face 7a of the package 1 after demolding. Such infiltrations are greater the more liquid the encapsulation material that is injected. Because of the structure of the insert in this embodiment, this flash lies some distance away from the edge of the less rough region 8 that faces the chip 3.

FIG. 6 shows yet another embodiment for a part of the injection mold. As shown, in this embodiment the lower part 10 of the mold 9 is fitted with an insert 30 such as one identical to the insert 15 of the embodiment described above with reference to FIGS. 2 to 4. This insert 30 protrudes into the cavity 13 slightly, so as to form a hollow in the package 1 in the less rough region 8 that corresponds to the transverse face of the insert 30. In this embodiment, the front part of the passage 14 that accommodates the insert 30 is enlarged so as to create a blind annular space 14a emerging in the cavity 13 and having an annular peripheral groove 14b in the part furthest away from this cavity.

Thus, when molding a first package 1, the annular space 14a and groove 14b fill with injected encapsulation material. When this first package is demolded, the injected material in the space 14a and the groove 14, which protrudes from the face 7a of the package, breaks off at this face and remains in the space 14a and in the groove 14b. Thus, the injection material remaining in the space 14a and the groove 14b constitute a plug such that, when subsequently molding packages 1, no flash is formed on the face 7a of the package. Further, this feature of the embodiment of FIG. 6 can also be combined with the structure of the embodiment of FIG. 5.

While there has been illustrated and described what are presently considered to be the preferred embodiments of the present invention, it will be understood by those skilled in the art that various other modifications may be made, and equivalents may be substituted, without departing from the true scope of the present invention. Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

What is claimed is:

1. An injection mold for encapsulating an integrated circuit chip in an encapsulation material so as to form a semiconductor package containing the chip, said injection mold comprising:

at least one injection cavity defined by a wall, the injection cavity being able to house the chip and receive the encapsulation material so as to encapsulate the chip in a block of the encapsulation material; and an insert fixedly attached so as to have a transverse surface that lies parallel to one face of the chip and a front part that forms a first portion of the wall of the injection cavity such that the encapsulation material is able to contact the transverse surface of the insert during encapsulation so that the transverse surface of the insert determines the roughness of a region of the face of the block of encapsulation material that corresponds to the transverse surface of the insert, wherein the transverse surface of the insert has a roughness that is chosen such that the face of the block of encapsulation material of the semiconductor package has a suitable roughness in the region of the face of the block of encapsulation material corresponding to the transverse surface of the insert.

2. The injection mold according to claim 1, wherein the insert protrudes into the interior of the injection cavity so as to form a hollow in the package in the region corresponding to the transverse surface of the insert.

3. The injection mold according to claim 1, further comprising a blind annular space around at least a part of the insert, the blind annular space emerging in the injection cavity.

4. The injection mold according to claim 1, further comprising:

first and second parts having a parting line between them defining the injection cavity, wherein the first part has a passage in which the insert is fixed in such a way that the transverse surface of the insert lies parallel to the parting line of the first and second parts, and the second part is provided with at least one movable demolding member opposite the insert and means for keeping the demolding member bearing on the package when the second part of the mold is separated from the first part of the mold during demolding.

5. The injection mold according to claim 1, further comprising a first part that forms a second portion of the wall of the injection cavity, the first part having a passage in which the insert is fixed such that the front part of the insert forms the first portion of the wall of the injection cavity.

6. The injection mold according to claim 1, wherein the transverse surface of the insert is sized such that the region of the face of the block of encapsulation material of the optical semiconductor package at least substantially covers an optical sensor of the chip.

7. The injection mold according to claim 1, wherein the roughness of the transverse surface of the insert is chosen such that the region of the face of the block of encapsulation material has a roughness that is less than the roughness of at least the rest of the transverse face of the encapsulation block.

8. The injection mold according to claim 1, wherein the front part of the insert has a protruding transverse surface surrounded by an annular shoulder that is set back with respect to the protruding transverse surface.

9. The injection mold according to claim 2, further comprising a blind annular space around at least a part of the insert, the blind annular space emerging in the injection cavity.

10. The injection mold according to claim 8, further comprising a blind annular space around at least a part of the insert, the blind annular space emerging in the injection cavity.

11. The injection mold according to claim 3, wherein the annular space is enlarged in a part remote from the injection cavity.

12. The injection mold according to claim 4, wherein the first part of the mold includes pushers for demolding the package.

13. The injection mold according to claim 5, further comprising a second part that forms a third portion of the wall of the injection cavity, the first and second parts having a parting line and between them defining the injection cavity.

14. An injection mold for encapsulating an integrated circuit chip in a block of encapsulation material so as to form an optical semiconductor package containing the chip, said injection mold comprising:

a first part and a second part having a parting line, the first part having a passage;

at least one injection cavity defined between the first and second parts, the injection cavity being able to house the chip during encapsulation; and an insert fixedly attached to the first part such that the insert is fixed in the passage of the first part so as to have a transverse surface that lies parallel to one face of the chip and a front part that forms a portion of the wall of the injection cavity such that the encapsulation material is able to contact the transverse surface of the insert during encapsulation so that the transverse surface of the insert determines the roughness of a region of the face of the block of encapsulation material that corresponds to the transverse surface of the insert, wherein the transverse surface of the insert has a roughness that is chosen such that the face of the block of encapsulation material of the optical semiconductor package has a suitable roughness in the region of the face of the block of encapsulation material corresponding to the transverse surface of the insert.

15. An optical semiconductor package formed in an injection mold for encapsulating at least one integrated circuit chip in an encapsulation material, said injection mold comprising:

at least one injection cavity defined by a wall, the injection cavity being able to house the chip and receive the encapsulation material so as to encapsulate the chip in a block of the encapsulation material; and an insert having a front part that forms a first portion of the wall of the injection cavity and a transverse surface that lies parallel to one face of the chip, wherein the transverse surface of the insert has a roughness that is chosen such that the face of the optical semiconductor package has a suitable roughness in a region corresponding to the transverse surface of the insert, said optical semiconductor package comprising:

an encapsulation block having a transverse face; and at least one integrated circuit chip contained in the encapsulation block, one face of the chip including an optical sensor and lying parallel to the transverse face of the encapsulation block, wherein the material of the encapsulation block that encapsulates the chip is transparent, the transverse face of the encapsulation block includes a region located opposite the optical sensor that has a roughness that is less than the roughness of at least the rest of the transverse face of the encapsulation block, and the region of the transverse face of the encapsulation block of the optical semiconductor package at least substantially covers the optical sensor of the chip.

16. The semiconductor package according to claim 15, wherein the region of the transverse face of the encapsulation block of the optical semiconductor package at least covers the optical sensor of the chip.

17. The semiconductor package according to claim 15, wherein the roughness of the region is less than 0.10.

18. The semiconductor package according to claim 15, wherein the roughness of the region is less than 0.07.

19. An information processing system including at least one optical semiconductor package according to claim 15.

20. The information processing system according to claim 19, wherein the region of the transverse face of the encapsulation block of the optical semiconductor package at least covers the optical sensor of the chip.

21. The information processing system according to claim 19, wherein the roughness of the region of the transverse face of the encapsulation block of the optical semiconductor package is less than 0.10.

22. The information processing system according to claim 19, wherein the roughness of the region of the transverse face of the encapsulation block of the optical semiconductor package is less than 0.07.

* * * * *